United States Patent [19]

Ackermann et al.

[11] Patent Number: 5,574,001
[45] Date of Patent: Nov. 12, 1996

[54] CERAMIC SUPERCONDUCTING LEAD RESISTANT TO BREAKAGE

[75] Inventors: Robert A. Ackermann, Schenectady; Kenneth G. Herd, Niskayuna; Evangelos T. Laskaris, Schenectady; Richard A. Ranze, Scotia, all of N.Y.

[73] Assignee: General Electric Company, Schenectady, N.Y.

[21] Appl. No.: 439,170

[22] Filed: May 11, 1995

Related U.S. Application Data

[62] Division of Ser. No. 329,919, Oct. 27, 1994, abandoned.

[51] Int. Cl.$^6$ .................................................. B32B 9/00
[52] U.S. Cl. ..................... 505/231; 428/688; 428/930; 174/125.1; 335/300; 335/296; 505/701
[58] Field of Search .................... 505/233–239, 505/701–704, 162, 231, 230; 335/300, 296; 174/125.1; 428/209, 210, 688, 930

[56] References Cited

U.S. PATENT DOCUMENTS

| | | | |
|---|---|---|---|
| 3,684,816 | 8/1972 | Reighter | 174/28 |
| 3,767,838 | 10/1973 | McConnell | 174/28 |
| 4,600,802 | 7/1986 | Ihas | 62/514 |
| 4,635,450 | 1/1987 | Laskaris | 62/45.1 |
| 4,876,413 | 10/1989 | Vermilyea . | |
| 4,895,831 | 1/1990 | Laskaris . | |
| 4,926,647 | 5/1990 | Dorri et al. . | |
| 4,930,318 | 6/1990 | Brzozowski . | |
| 4,966,886 | 10/1990 | Hoshiko | 174/125.1 |
| 5,006,507 | 4/1971 | Woolf | 505/704 |
| 5,111,665 | 5/1992 | Ackermann . | |
| 5,248,656 | 9/1993 | Nagesh | 505/740 |
| 5,260,266 | 11/1993 | Herd et al. . | |

OTHER PUBLICATIONS

"Grain-Aligned YBCO Superconducting Current Leads for Conduction-Cooled Applications", by KG Herd et al., IEEE Transactions on Applied Superconductivity, vo. 3, No. 1, Mar. 1993.

"Cold Head Sleeve and High Tc Superconducting lead Assemblies for a Superaconducting Magnet which Images Human Limbs", Laskaris et al., U.S. Application Ser. No. 08/000,303, filed Jan. 4, 1993.

Concurrently filed U.S. Patent Application RD–23426 entitled "Ceramic Superconducting Lead Resistant to Moisture and Breakage", by Robert A. Ackermann et al.

U.S. Patent Application Serial No. 08/209,287, filed Mar. 14, 1994, Entitled "Superconducting Lead Assembly for a Cryocooler-Cooled Superconducting Magnet", by Kenneth G. Herd et al.

*Primary Examiner*—Patrick Ryan
*Assistant Examiner*—Patrick Jewik
*Attorney, Agent, or Firm*—Douglas E. Erickson; William H. Pittman

[57] ABSTRACT

A superconductive lead assembly for a superconductive device (e.g., magnet) cooled by a cryocooler coldhead having first and second stages. A first ceramic superconductive lead has a first end flexibly, dielectrically, and thermally connected to the first stage and a second end flexibly, dielectrically, and thermally connected to the second stage. A jacket of open cell material (e.g., polystyrene foam) is in general surrounding compressive contact with the first ceramic superconductive lead, and a rigid support tube generally surrounds the jacket. This protects the first ceramic superconductive lead against shock and vibration while in the device. The rigid support tube has a first end and a second end, with the second end thermally connectable to the second stage.

1 Claim, 2 Drawing Sheets

5,574,001

CERAMIC SUPERCONDUCTING LEAD RESISTANT TO BREAKAGE

This invention was made with Government support under Government Contract No. N61533-93-C-0074 awarded by the Navy. The Government has certain rights to this invention.

This application is a division of application Ser. No. 08/329,919, filed Oct. 27, 1994, now abandoned.

BACKGROUND OF THE INVENTION

The present invention relates generally to a superconductive lead assembly for a superconductive device cooled by a cryocooler coldhead, and more particularly to such an assembly which has ceramic superconductive leads resistant to breakage.

Superconducting devices include, but are not limited to, superconducting magnetic-energy storage devices, superconducting rotors, and superconducting magnets. Superconducting magnets include those having ceramic superconductive leads which supply electricity to the superconductive coils which generate uniform and high strength magnetic fields. Superconducting magnets include those used in magnetic resonance imaging (MRI) systems employed in the field of medical diagnostics. Known techniques for cooling a superconductive magnet include those in which the superconductive coil is cooled through solid conduction by a cryocooler coldhead.

Known ceramic superconductive leads include DBCO (Dysprosium Barium Copper Oxide), YBCO (Yttrium Barium Copper Oxide), and BSCCO (Bismuth Strontium Calcium Copper Oxide) superconducting leads having a first end flexibly, dielectrically, and thermally connected to the cryocooler coldhead's first stage (at a temperature of generally 40 Kelvin) and a second end flexibly, dielectrically, and thermally connected to the cryocooler coldhead's second stage (at a temperature of generally 10 Kelvin).

Great care must be exercised when handling ceramic superconductive leads because they are brittle and break easily such as during installation of the leads in the magnet. In addition, superconductive leads installed in a superconductive device are sometimes subject to shock and vibration forces which could lead to breakage. For example, the superconductive leads in an MRI magnet are susceptible to shock and vibration forces during magnet shipping and installation, and the superconductive leads in a naval magnet are susceptible to shock and vibration forces while the magnet is in use during mine-sweeping operations. Known ceramic superconductive lead assemblies offer no protection against breakage due to handling of the lead or due to shock and vibration forces experienced during shipping and installation of the superconductive device containing the lead assemblies. What is needed is a superconductive lead assembly for a superconductive device cooled by a cryocooler coldhead wherein the ceramic superconductive leads are protected against breakage.

SUMMARY OF THE INVENTION

It is an object of the invention to provide a superconductive lead assembly, for a cryocooler-cooled superconducting magnet, wherein the ceramic superconductive leads are protected against breakage.

The superconductive lead assembly of the present invention is for a superconductive device cooled by a cryocooler coldhead having a first stage and a second stage. The superconductive lead assembly includes a first ceramic superconductive lead. The first ceramic superconductive lead has a first end flexibly, dielectrically, and thermally connectable to the first stage of the cryocooler coldhead and has a second end flexibly, dielectrically, and thermally connectable to the second stage of the cryocooler coldhead. The superconductive lead assembly also includes a jacket (such as a polystyrene foam jacket) and a rigid support tube (such as a stainless steel support tube). The jacket has a coefficient of thermal conductivity generally not exceeding that of glass reinforced epoxy at a temperature of generally 50 Kelvin, and the rigid support tube has a coefficient of thermal conductivity generally not exceeding that of stainless steel at a temperature of 50 Kelvin. The jacket is in general surrounding compressive contact with the first ceramic superconductive lead. The rigid support tube generally surrounds the jacket, has a first end spaced apart from the first stage of the cryocooler coldhead, and has a second end thermally connectable to the second stage of the cryocooler coldhead.

Several benefits and advantages are derived from the invention. The surrounding polystyrene foam jacket and stainless steel rigid support tube protect the first ceramic superconductive lead installed in the superconductive device from breakage under shock and vibration forces.

BRIEF DESCRIPTION OF THE DRAWINGS

The accompanying drawings illustrate a preferred embodiment of the present invention wherein.

DETAILED DESCRIPTION OF THE INVENTION

Figure 1:
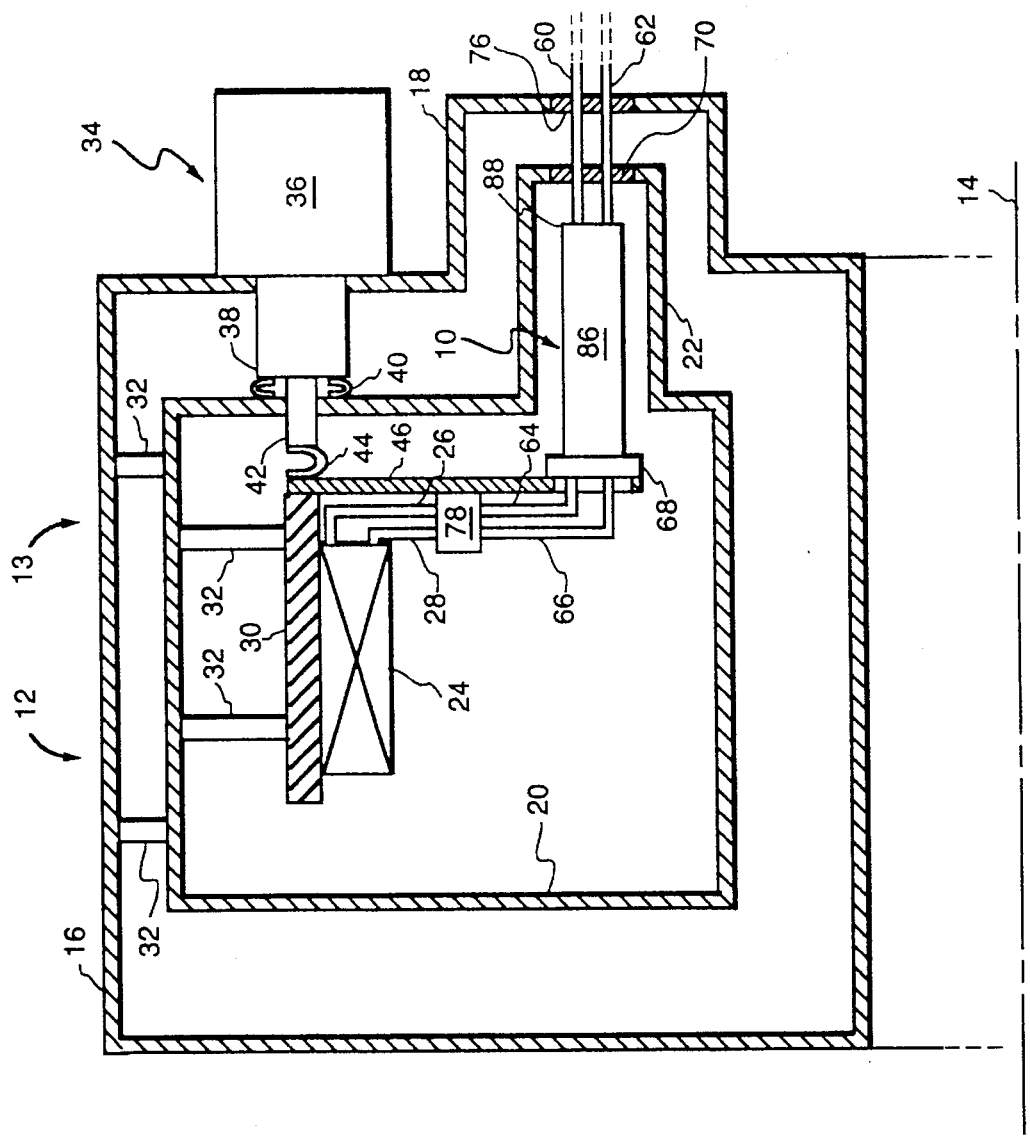
FIG. 1 is a schematic side-elevational, cross-sectional view of a portion of a superconductive magnet cooled by a cryocooler coldhead and containing a preferred embodiment of the superconductive lead assembly of the present invention.
Figure 2:
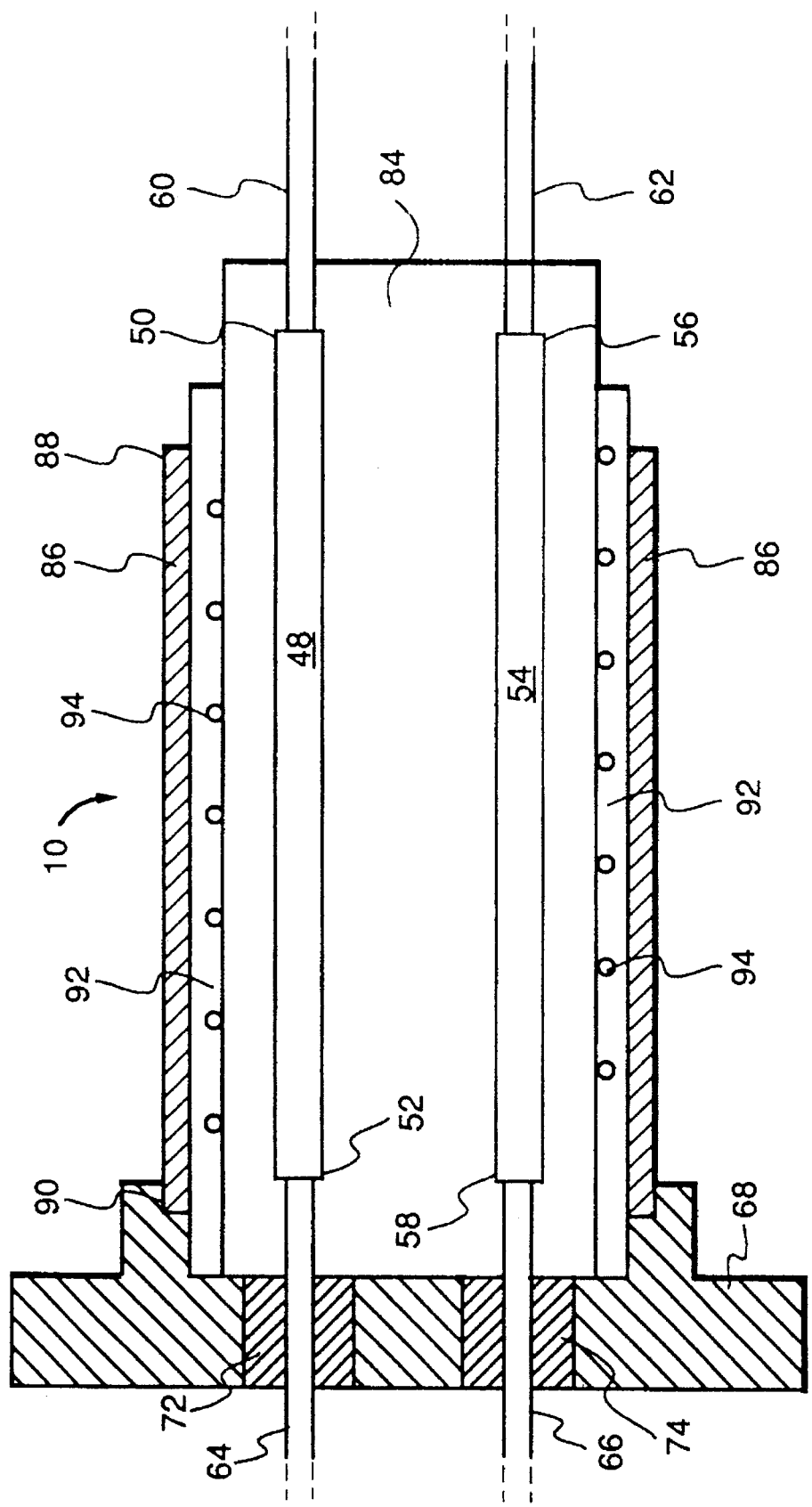
FIG. 2 is an enlarged schematic cross-sectional view of the superconductive lead assembly of FIG. 1.

Referring now to the drawings, wherein like numerals represent like elements throughout, FIGS. 1 and 2 show a preferred embodiment of the superconductive lead assembly 10 of the present invention. The superconductive lead assembly 10 is for a superconductive device 12. The superconductive device 12 shown in FIG. 1 is a superconductive magnet 13. Other superconductive devices include, but are not limited to, superconductive magnetic-energy storage devices and superconductive rotors.

Preferably, the superconductive magnet 13 includes a generally longitudinally extending axis 14 and a generally annularly-cylindrical-shaped vacuum enclosure 16 generally coaxially aligned with the axis 14. The vacuum enclosure 16 includes a portion 18 which hermetically encloses the superconductive lead assembly 10. The magnet 13 also includes a generally annularly-cylindrical-shaped thermal shield 20 generally coaxially aligned with the axis 14 and disposed within and spaced apart from the vacuum enclosure 16. The thermal shield 20 includes a portion 22 which thermally shields the superconductive lead assembly 10. The magnet 13 further includes a generally solenoidal-shaped superconductive coil 24 generally coaxially aligned with the axis 14 and disposed within and spaced apart from the thermal shield 20. The superconductive coil 24 typically is wound from a single (or spliced) length of superconductive wire or tape (such as niobium-tin superconductive tape)

having first and second ends 26 and 28. A coil overband 30, typically made of aluminum, is shrunk fit over the superconductive coil 24. Radially-oriented thermal insulating tubes 32, typically made of filamentary carbon graphite, position the thermal shield 20 with respect to the vacuum enclosure 16 and (through the coil overband 30) position the superconductive coil 24 with respect to the thermal shield 20. A more secure support for the superconductive coil is to employ racetrack-shaped tie rod straps (not shown in the figures), typically made of mono-filamentary glass or carbon graphite, to support a structural extension of the superconductive coil from the vacuum enclosure. An attachment offering better shock and vibration protection for the superconductive coil is to employ a magnet re-entrant support assembly (not shown in the figures) as disclosed in U.S. patent application Ser. No. 08/307,700 entitled "Superconducting Magnet Having a Shock-Resistant Support Structure" by Evangelos T. Laskaris et al. filed Sep. 21, 1994, which is hereby incorporated by reference.

The superconductive magnet 13 is cooled by a cryocooler coldhead 34 (such as that of a Gifford-McMahon cryocooler) having a housing 36 generally hermetically connected to the vacuum enclosure 16 (such as by bolts, not shown), a first stage 38 disposed in solid-conductive thermal contact with the thermal shield 20 (such as by having the first stage 38 in thermal contact with a flexible thermal busbar 40 which is in thermal contact with the thermal shield 20) and a second stage 42 disposed in solid-conductive thermal contact with the superconductive coil 24 (such as by having the second stage 42 in thermal contact with a flexible thermal busbar 44 which is in thermal contact with a cooling ring 46 which is in thermal contact with the coil overband 30 which is in thermal contact with the superconductive coil 24). An alternate system (not shown in the figures) for cooling a superconductive magnet with a cryocooler coldhead includes a solid busbar having one end in solid-conductive thermal contact with the superconductive coil and having the other end disposed in a volume of liquid and gaseous helium with the gaseous helium cooled by the cryocooler coldhead.

The superconductive lead assembly 10 includes a first ceramic superconductive lead 48 having a first end 50 flexibly, dielectrically, and thermally connectable (and connected) to the first stage 38 of the cryocooler coldhead 34 and a second end 52 flexibly, dielectrically, and thermally connectable (and connected) to the second stage 42 of the cryocooler coldhead 34. The superconductive lead assembly 10 also includes a second ceramic superconductive lead 54 generally identical to and spaced apart from the first ceramic superconductive lead 48. The second ceramic superconductive lead 54 has a first end 56 flexibly, dielectrically, and thermally connectable (and connected) to the first stage 38 of the cryocooler coldhead 34 and a second end 58 flexibly, dielectrically, and thermally connectable (and connected) to the second stage 42 of the cryocooler coldhead 34.

A preferred arrangement for such connections is for the superconductive lead assembly 10 to further include flexible copper-braid leads 60, 62, 64, and 66, a rigid copper thermal station 68, and nickel-plated beryllia collars 70, 72, and 74. Each end 50, 52, 56, and 58 of the ceramic superconductive leads 48 and 54 has a silver pad sintered thereto, with a copper fitting soldered to each pad securing a crimped end of a corresponding flexible copper-braid lead 60, 62, 64 and 66 (such silver pads and copper fittings not shown in the figures). Flexible copper-braid leads 60 and 62 are dielectrically and thermally connectable (and connected) to the first stage 38 of the cryocooler coldhead 34 by passing through and contacting a beryllia collar 70 secured to the thermal shield 20 which contacts the first stage 38 via flexible thermal busbar 40. Flexible copper-braid leads 60 and 62 then pass through a ceramic lead feedthrough 76 hermetically attached to the vacuum enclosure portion 18 enclosing the superconductive lead assembly 10 and thereafter are electrically connected to a source of electricity (not shown in the figures). Flexible copper-braid leads 64 and 66 are dielectrically and thermally connectable (and connected) to the second stage 42 of the cryocooler coldhead 34 by passing through and contacting respective beryllia collars 72 and 74 secured to the rigid thermal station (or flange) 68 which contacts the second stage 42 via cooling ring 46 and flexible thermal busbar 44. Thus, it is seen that the second ends 52 and 58 of the first and second ceramic superconductive leads 48 and 54 are flexibly, dielectrically, and thermally connected to the rigid thermal station 68. It is noted that the rigid thermal station 68 is attached to the cooling ring 46 to provide cooling to the ceramic superconductive leads 48 and 54. Flexible copper-braid leads 64 and 66 thereafter are electrically connected to the respective ends 26 and 28 of the superconductive wire/tape which defines the superconductive coil 24, such electrical connection being made by a terminal block 78 secured to the cooling ring 46.

For protection of the superconductive lead assembly 10 against breakage during handling and against shock and vibration forces when installed in the superconductive magnet 13, the superconductive lead assembly 10 further includes a jacket 84 and a rigid support tube 86. The jacket 84 comprises an open cell material having a coefficient of thermal conductivity generally not exceeding that of glass reinforced epoxy at a temperature of generally 50 Kelvin. The jacket 84 is in general surrounding compressive contact with the first and second ceramic superconductive leads 48 and 54. The rigid support tube 86 generally surrounds the jacket 84, has a coefficient of thermal conductivity generally not exceeding that of stainless steel at a temperature of 50 Kelvin. The rigid support tube 86 has a first end 88 and a second end 90. The second end 90 is thermally connectable (and connected) to the second stage 42 of the cryocooler coldhead 34. It is noted that the second end 90 of the rigid support tube 86 is rigidly attached to the rigid thermal station 68, and that the rigid thermal station 68 is thermally connectable (and connected) to the second stage 42 of the cryocooler coldhead 34 (via cooling ring 46 and flexible thermal busbar 44). The jacket 84 uniformly supports and distributes the forces on the superconductive lead assembly 10 when subjected to shock and vibration loads while installed in the superconductive device 12. The rigid support tube 86 supports the jacket 84 against transverse and axial forces.

Preferably, the superconductive lead assembly 10 additionally includes a glass-reinforced-epoxy jacket overwrap 92 in general surrounding contact with and attached to the jacket 84. In this embodiment, the rigid support tube 86 is in general surrounding contact with and attached to the glass-reinforced-epoxy jacket overwrap 92. In an exemplary embodiment, and to overcome a tendency of the jacket 84 to otherwise separate from the ceramic superconductive leads 48 and 54 resulting in undesirable vibrational contact, the superconductive lead assembly 10 moreover includes a metallic wire 94 for better attachment of the jacket 84 to the ceramic superconductive leads 48 and 54. The metallic wire 94 is disposed within the rigid support tube 86 and generally helically wound around the jacket 84 binding it. The metallic wire 94 has a coefficient of thermal expansion generally equal to that of the rigid support tube 86. In this embodiment, the glass-reinforced-epoxy jacket overwrap 92 is also attached to the metallic wire 94. It is Applicants' judgment that use of the jacket 84, metallic wire 94, glass-reinforced-epoxy jacket overwrap 92, rigid support tube 86, and rigid thermal station 68 will provide good shock and vibration protection for the ceramic superconductive leads 48 and 54 when they are installed in the superconductive magnet 13 (or other superconductive device).

In an exemplary embodiment, each of the first and second ceramic superconductive leads 48 and 54 is a polycrystalline sintered ceramic superconducting lead. Preferably, each ceramic superconductive lead 48 and 54 comprises an identical material selected from the group consisting of DBCO (Dysprosium Barium Copper Oxide), YBCO (Yttrium Barium Copper Oxide), and BSCCO (Bismuth Strontium Calcium Copper Oxide). It is preferred that the ceramic superconductive leads 48 and 54 are each grain-aligned DBCO, grain-aligned YBCO, or grain-aligned BSCCO superconductive leads. Grain alignment is preferred because it improves the performance of the lead in a stray magnetic field. Preferably, the jacket 84 comprises a polystyrene foam jacket, and the rigid support tube 86 comprises a stainless steel support tube or a titanium support tube. It is preferred that the flexible copper-braid leads 60, 62, 64, and 66 comprise OFHC (oxygen-free hard copper) copper. The flexible thermal busbars 40 and 44 are preferably made of laminated OFHC copper.

It is noted that, during the normal superconductive mode of magnet operation, electric current flows superconductively in the ceramic superconductive leads 48 and 54 and in the superconductive coil 24, and electric current flows non-superconductively in the non-superconducting flexible copper-braid leads 60, 62, 64, and 66. It is further noted that the superconductive lead assembly 10 affords high thermal impedance between its ceramic superconductive lead's first ends 50 and 56 (which are typically at a temperature of generally 40 Kelvin) and second ends 52 and 58 (which are typically at a temperature of generally 10 Kelvin).

A preferred method for making the superconductive lead assembly 10 for the superconductive device 12 comprises the steps of: a) obtaining the first ceramic superconductive lead 48 having a length; b) obtaining a second ceramic superconductive lead 54 generally identical to the first ceramic superconductive lead 48 and having a length; c) choosing an open cell material having a coefficient of thermal conductivity generally not exceeding that of glass reinforced epoxy at a temperature of generally 50 Kelvin; d) preparing a lower block of the open cell material with spaced-apart cutouts to generally surround one-half of the first and second ceramic superconductive leads 48 and 54; e) preparing an upper block of the open cell material with spaced-apart cutouts to generally surround the other half of the first and second ceramic superconductive leads 48 and 54; f) surrounding the first and second ceramic superconductive leads 48 and 54 with the lower and upper blocks so as to define the jacket 84 in general surrounding contact with the first and second ceramic superconductive leads 48 and 54; g) generally helically winding the metallic wire 94 around the jacket 84 binding it such that the jacket 84 is in general surrounding compressive contact with the first and second ceramic superconductive leads 48 and 54; h) preparing a wet layup of glass-reinforced-epoxy having a width less than the length of the first ceramic superconductive lead 48; i) generally helically winding the jacket overwrap 92 of the wet layup of glass-reinforced-epoxy directly onto and around the jacket 84 and the metallic wire 94 with an overlap of generally one-half of the width of the wet layup of glass-reinforced-epoxy; j) obtaining the rigid support tube 86 having a coefficient of thermal expansion generally equal to that of the metallic wire 94 and having a length smaller than that of the jacket overwrap 92; k) inserting the jacket overwrap 92 into the rigid support tube 86; and r) air-curing the inserted jacket overwrap 92 at generally room temperature for at least 8 hours.

The foregoing description of a preferred embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:

1. In combination with a superconductive device cooled by a cryocooler coldhead having a first stage and a second stage, a superconductive lead assembly comprising:

a) a first ceramic superconductive lead having a first end thermally connected to said first stage and a second end thermally connected to said second stage;

b) a jacket comprising an open cell material having a coefficient of thermal conductivity not exceeding that of glass reinforced epoxy at a temperature of 50 Kelvin, said jacket in surrounding compressive contact with said first ceramic superconductive lead;

c) a rigid support tube surrounding said jacket, having a coefficient of thermal conductivity not exceeding that of stainless steel at a temperature of 50 Kelvin, having a first end, and having a second end thermally connected to said second stage;

d) a glass-reinforced-epoxy jacket overwrap in general surrounding contact with and attached to said jacket, and wherein said rigid support tube is in general surrounding contact with and attached to said glass-reinforced-epoxy jacket overwrap;

e) a metallic wire disposed within said rigid support tube and generally helically wound around said jacket binding it, wherein said metallic wire has a coefficient of thermal expansion generally equal to that of said rigid support tube, and wherein said glass-reinforced-epoxy jacket overwrap is also attached to said metallic wire; and f) a second ceramic superconductive lead generally identical to and spaced apart from said first ceramic superconductive lead, said second ceramic superconductive lead having a first end flexibly, dielectrically, and thermally connectable to said first stage and a second end flexibly, dielectrically, and thermally connectable to said second stage, with said jacket also in general surrounding compressive contact with said second ceramic superconductive lead.

\* \* \* \* \*